（12） United States Patent
Yamakawa et al.

(10) Patent No.: US 10,446,458 B2
(45) Date of Patent: Oct. 15, 2019

(54) RESIN MOLDED BODY

(71) Applicant: DENSO CORPORATION, Kariya, Aichi-pref. (JP)

(72) Inventors: Hiroyuki Yamakawa, Kariya (JP); Ryosuke Izumi, Kariya (JP); Motomi Ishikawa, Kariya (JP); Norihito Yoshida, Kariya (JP); Hodaka Mori, Kariya (JP)

(73) Assignee: DENSO CORPORATION, Kariya (JP)

( * ) Notice: Subject to any disclaimer, the term of this patent is extended or adjusted under 35 U.S.C. 154(b) by 20 days.

(21) Appl. No.: 15/768,038

(22) PCT Filed: Jan. 7, 2017

(86) PCT No.: PCT/JP2017/000352
§ 371 (c)(1),
(2) Date: Apr. 13, 2018

(87) PCT Pub. No.: WO2017/126347
PCT Pub. Date: Jul. 27, 2017

(65) Prior Publication Data
US 2018/0315675 A1    Nov. 1, 2018

(30) Foreign Application Priority Data

Jan. 22, 2016    (JP) .................................. 2016-010823

(51) Int. Cl.
*B32B 3/26*    (2006.01)
*H01L 23/29*    (2006.01)
(Continued)

(52) U.S. Cl.
CPC ............ *H01L 23/293* (2013.01); *B29C 65/00* (2013.01); *H01L 21/56* (2013.01); *H01L 21/565* (2013.01);
(Continued)

(58) Field of Classification Search
CPC .... Y10T 428/23; Y10T 428/239; H01L 23/29; H01L 23/31; H01L 23/293; B32B 3/26
See application file for complete search history.

(56) References Cited

U.S. PATENT DOCUMENTS

2013/0078423 A1    3/2013    Sutou et al.
2014/0305914 A1    10/2014    Sutou et al.
2016/0336199 A1    11/2016    Harada et al.

FOREIGN PATENT DOCUMENTS

JP    2003-249605 A    9/2003
JP    2010-071723 A    4/2010
(Continued)

*Primary Examiner* — Alexander S Thomas
(74) *Attorney, Agent, or Firm* — Posz Law Group, PLC (57) ABSTRACT

A part of the sealed surface of the thermosetting resin member is a non-roughened surface that is not subjected to a roughening treatment. The other part of the sealed surface is a roughened surface recessed from the non-roughened surface to form a step and more roughened than the non-roughened surface. The thermoplastic resin member includes an additive added thereto, and the additive contains a functional group. A functional group existing in the roughened surface and the functional group existing in the additive are chemically bonded together. The roughened surface has a closed-circular shape that is formed over an entire circumference of the sealed surface around an axis parallel to the first direction. The three or more roughened surfaces each having a closed-circular shape on the sealed surface are arranged along the first direction with the non-roughened surface interposed as a distance between each adjacent two of the roughened surfaces.

5 Claims, 4 Drawing Sheets

(51) Int. Cl.
*B29C 65/00* (2006.01)
*H01L 23/31* (2006.01)
*H01L 21/56* (2006.01)
*H01L 23/00* (2006.01)

(52) U.S. Cl.
CPC .............. *H01L 23/29* (2013.01); *H01L 23/31* (2013.01); *H01L 23/3107* (2013.01); *H01L 23/3135* (2013.01); *H01L 23/3142* (2013.01); *B32B 3/26* (2013.01); *H01L 24/45* (2013.01); *H01L 24/48* (2013.01); *H01L 2224/45124* (2013.01); *H01L 2224/45144* (2013.01); *H01L 2224/48091* (2013.01); *H01L 2224/48175* (2013.01); *H01L 2224/48247* (2013.01); *Y10T 428/23* (2015.01)

(56) References Cited

FOREIGN PATENT DOCUMENTS

| JP | 2013-125825 A | 6/2013 |
| JP | 2015-162503 A | 9/2015 |

RESIN MOLDED BODY

CROSS REFERENCE TO RELATED APPLICATIONS

This application is a U.S. national phase of International Application No. PCT/JP2017/000352 filed on Jan. 7, 2017 and is based on Japanese Patent Application No. 2016-10823 filed on Jan. 22, 2016, the contents of which are incorporated herein by reference.

TECHNICAL FIELD

The present disclosure relates to a resin molded body produced by: sealing a part of the surface of a thermosetting resin member with a thermoplastic resin member; and exposing the other part of the surface of the thermosetting resin member from the thermoplastic resin member.

BACKGROUND ART

As a resin molded body of this sort, proposed is a resin molded body produced by: preparing a thermosetting resin member comprising a thermosetting resin and a thermoplastic resin member comprising a thermoplastic resin; and sealing a sealed surface that is a part of the surface of the thermosetting resin member with the thermoplastic resin member and using the other part of the surface as an exposed surface (refer to Patent Document 1).

Then in such a resin molded body, a part of a sealed surface of a thermosetting resin member is a non-roughened surface that is not subjected to a roughening treatment and the other part of the sealed surface is a roughened so surface that is more recessed stepwise and more roughened than the non-roughened surface. Such a roughening treatment of forming a roughened surface is a process for removing a surface by laser irradiation or the like and the roughened surface therefore is a surface that is more recessed stepwise and has a better adhesiveness with a thermoplastic resin member than a non-roughened surface.

Further, such a resin molded body is in the state of adding an additive containing a functional group to a thermoplastic resin member and chemically bonding a functional group existing at a roughened surface and the functional group existing in the additive. In such a conventional resin molded body in this way, in the event of forming a roughened surface in a sealed surface that is a part of the surface of a thermosetting resin member and sealing the sealed surface with a thermoplastic resin member, adhesiveness is attempted to improve by mechanically bonding both the resin members at the roughened surface and further applying chemical bonding.

PRIOR ART DOCUMENT

Patent Document

Patent Document 1: JP 2015-162594 A

Meanwhile, in such a conventional resin molded body, a roughened surface is formed as one continuous region at a part of a sealed surface of a thermosetting resin member and a step between the roughened surface and a non-roughened surface, namely a boundary between the roughened surface and the non-roughened surface, is sealed with a thermoplastic resin member.

On this occasion, at a sealed surface sealed with a thermoplastic resin member, when exfoliation generated at a non-roughened surface that is relatively poor in adhesiveness progresses up to a boundary between a roughened surface and the non-roughened surface, another exfoliation may undesirably be guided at a bonding interface between the roughened surface so and the thermoplastic resin member.

SUMMARY OF INVENTION

The present disclosure addresses the above issues. Thus, it is an objective of the present disclosure, in a resin molded body produced by forming a roughened surface at a part of a sealed surface of a thermosetting resin member and applying sealing by mechanical bonding and chemical bonding between the roughened surface and a thermoplastic resin member, to inhibit exfoliation from progressing at a bonding interface between both the resin members.

To achieve the objective, the present inventors have studied earnestly. Firstly, a direction oriented from a boundary between a sealed surface and an exposed surface of a thermosetting resin member toward the inside of a thermoplastic resin member is defined as a first direction. Here, the sealed surface is a surface that extends from one end, which is the boundary between the sealed surface and an exposed surface, toward the first direction and reaches the other end.

On this occasion, a stress caused by thermal expansion and thermal contraction generated at a sealed surface is larger on the sides of one end and the other end of the sealed surface than on the center side in the first direction. For the reason, exfoliation at a bonding interface is likely to progress from the side of one end or the other end of a sealed surface toward the center side in the first direction. The present disclosure is created in consideration of a difference in the magnitude of a stress generated at such a sealed surface.

A resin molded body in an aspect of the present disclosure includes a thermosetting resin member that is made of thermosetting resin, and a thermoplastic resin member that is made of thermoplastic resin to seal a sealed surface, which is a part of a surface of the thermosetting resin member. An exposed surface, which is the other part of the surface of the thermosetting resin member, is exposed from the thermoplastic resin member. The resin molded body has the following features.

Specifically, in the resin molded body of this aspect, a part of the sealed surface of the thermosetting resin member is a non-roughened surface that is not subjected to a roughening treatment. The other part of the sealed surface of the thermosetting resin member is a roughened surface, which is recessed from the non-roughened surface to form a step and is more roughened than the non-roughened surface. The thermoplastic resin member includes an additive added thereto, and the additive contains a functional group. A functional group existing in the roughened surface and the functional group existing in the additive are chemically bonded together. A direction from a boundary between the sealed surface and the exposed surface toward an inside of the thermoplastic resin member is a first direction. The roughened surface has a closed-circular shape that is formed over an entire circumference of the sealed surface around an axis parallel to the first direction. The roughened surface is one of three or more roughened surfaces each having a closed-circular shape on the sealed surface. The three or more roughened surfaces are arranged along the first direction with the non-roughened surface interposed as a distance between each adjacent two of the three or more roughened surfaces.

According to the aspect, a resin molded body is configured so as to align three or more closed-circular roughened surfaces at a sealed surface in a first direction that is an exfoliation progressing direction. As a result, even when exfoliation occurs at a roughened surface located on each of the end sides of a sealed surface in the first direction, namely at a roughened surface located at a part of a sealed surface where a stress is high, the exfoliation is inhibited from progressing because a step formed by a non-roughened surface exists between the roughened surface at which the exfoliation has occurred and a roughened surface located on the center side of the sealed surface.

Thus, in a resin molded body of this aspect produced by forming a roughened surface at a part of a sealed surface of a thermosetting resin member and applying sealing by mechanical bonding and chemical bonding between the roughened surface and a thermoplastic resin member, exfoliation can be inhibited from progressing at a bonding interface between both the resin members.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Embodiments are explained hereunder in reference to the drawings. Here, in the following respective embodiments, parts identical or equal to each other are represented by an identical reference sign in the drawings in order to simplify the explanations.

First Embodiment

Figure 1:
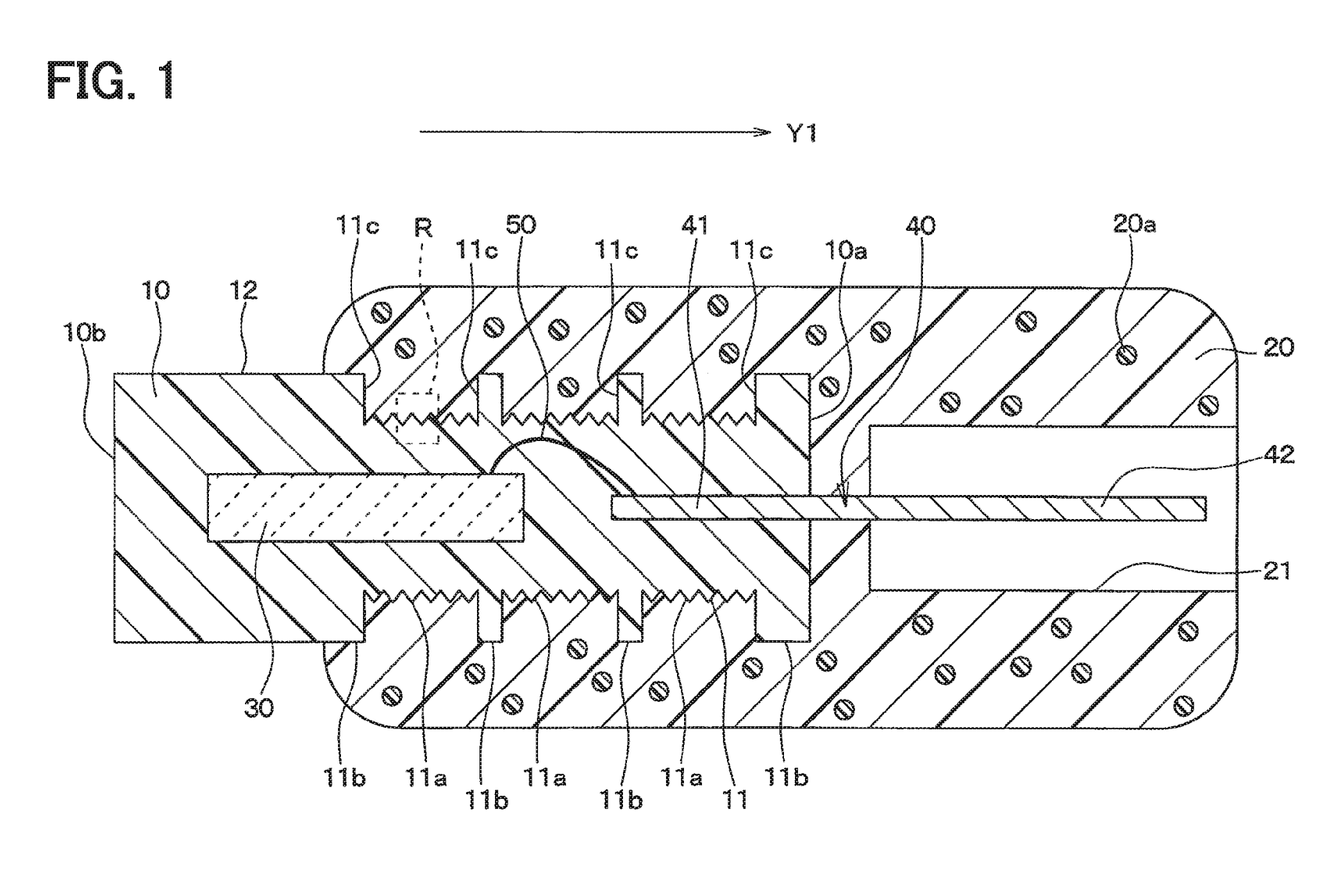
FIG. 1 is a schematic sectional view showing a semiconductor device as a resin molded body according to a first embodiment.
Figure 2:
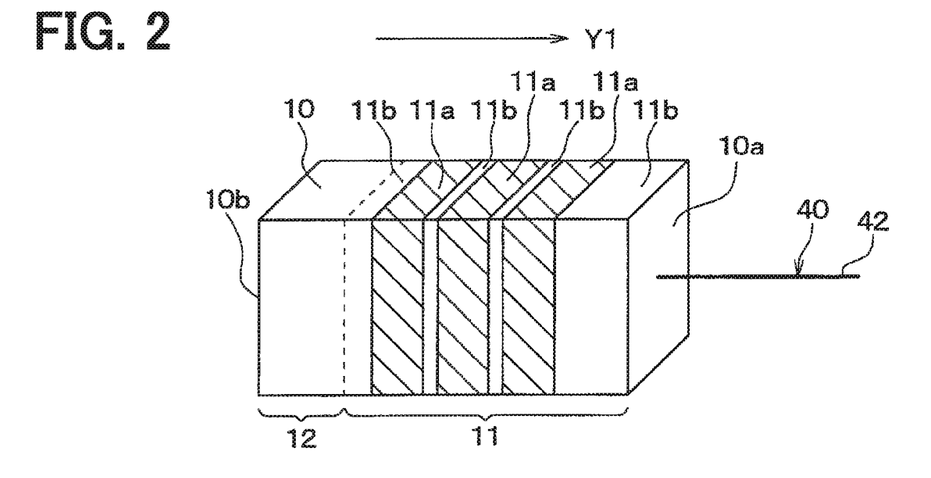
FIG. 2 is an external perspective view schematically showing a thermosetting resin member in the semiconductor device of FIG. 1.

A resin molded body according to a first embodiment is described in reference to FIGS. 1 and 2. Here, in FIG. 1, the uneven shape of roughened surfaces 11*a* and steps 11*c* formed at the surface of a thermosetting resin member 10 that will be described below are shown in a largely deformed manner for better understanding. Further, in FIG. 2, the roughened surfaces 11*a* formed at the surface of the thermosetting resin member 10 are shown by hatching.

Such a resin molded body, for example, is mounted over a vehicle such as an automobile and used as a semiconductor device for driving various electronic devices for the vehicle. A semiconductor device as a resin molded body according to the present embodiment includes a thermosetting resin member 10 and a thermoplastic resin member 20 to seal a part of the surface of the thermosetting resin member 10.

The thermosetting resin member 10 comprises a thermosetting resin such as an epoxy resin and the resin may contain a filler comprising an insulating material such as silica, alumina, or the like, if necessary. Such a thermosetting resin member 10 is formed by being: molded by transfer molding, compression molding, potting molding, or the like; and subjected to a thermosetting treatment.

Further, the thermoplastic resin member 20: comprises a thermoplastic resin such as PPS (polyphenylenesulfide), PBT (polybutylene terephthalate), or the like; and is formed by injection molding so as to seal a part of the thermosetting resin member 10. An additive 20*a* containing a functional group is added into the thermoplastic resin member 20.

The additive 20*a* comprises a polymer having at least one functional group selected from the groups of a hydroxyl group, an epoxy group, an amino group, a carbonyl group, and the like. The additive 20*a* reacts chemically with a functional group existing at a roughened surface 11*a* of the thermosetting resin member 10 and a highly adhesive bond between a thermosetting resin and a thermoplastic resin can be obtained.

By sealing a part of the surface of the thermosetting resin member 10 with the thermoplastic resin member 20 to which the additive 20*a* is added, the part of the surface of the thermosetting resin member 10 comes to be a sealed surface 11 sealed with the thermoplastic resin member 20. Then the other part of the surface of the thermosetting resin member 10 than the sealed surface 11 comes to be an exposed surface 12 exposed from the thermoplastic resin member 20.

Here, as shown in FIGS. 1 and 2, the thermosetting resin member 10 is configured so as to form a prismatic shape, specifically a cuboidal shape. Then the part of the surface of the thermosetting resin member 10 on the side of an end 10*a* of the thermosetting resin member 10 in a longitudinal direction is the sealed surface 11 and the other part of the surface of the thermosetting resin member 10 on the side of the other end 10*b* in the longitudinal direction is the exposed surface 12.

More specifically, the thermosetting resin member 10 shown in FIGS. 1 and 2 has a quadrangular columnar shape having an end surface and the other opposing end surface in a longitudinal direction and four side surfaces extending in the longitudinal direction.

Then the sealed surface 11 of the thermosetting resin member 10 includes the end surface in the longitudinal direction and the parts of the four side surfaces on the side of the end 10a in the longitudinal direction. In contrast, the exposed surface 12 of the thermosetting resin member 10 includes the other end surface in the longitudinal direction and the parts of the four side surfaces on the side of the other end 10b in the longitudinal direction.

The thermosetting resin member 10 has a semiconductor element 30 as a first sealed component sealed with the thermosetting resin member 10 and an electrical connection member 40 as a second sealed component in the interior.

The semiconductor element 30 as the first sealed component is a sensor chip formed of a silicon semiconductor or the like used for a magnetic sensor, an optical sensor, a pressure sensor, or the like. The semiconductor element 30 is formed through an ordinary semiconductor process.

In the case of a semiconductor element 30 for a magnetic sensor for example, the whole semiconductor element 30 is sealed with the thermosetting resin member 10 and the semiconductor element 30 detects exterior magnetism through the thermosetting resin member 10.

Otherwise, in the case of a semiconductor element 30 for an optical sensor or a pressure sensor, an opening not shown in the figures to expose a part of the semiconductor element 30 is formed in the thermosetting resin member 10 and the semiconductor element 30 detects light or pressure through the opening.

In the present embodiment here, a part of the thermosetting resin member 10 sealing the semiconductor element 30 is exposed from the thermoplastic resin member 20 so that excessive stress may not be loaded on the semiconductor element 30 for example.

Meanwhile, the electrical connection member 40 as the second sealed a component plays the role of electrically connecting the semiconductor element 30 to a wiring member that is placed outside the semiconductor device but is not shown in the figures. Here, a part 41 of the electrical connection member 40 is covered with the thermosetting resin member 10 and the other part 42 protrudes from the sealed surface 11 of the thermosetting resin member 10. Further, the other part 42 of the electrical connection member 40 is sealed with the thermoplastic resin member 20 outside the thermosetting resin member 10 and the tip part is exposed from the thermoplastic resin member 20.

Here, the part 41 of the electrical connection member 40 is electrically connected to the semiconductor element 30 in the thermosetting resin member 10. A method of being connected to the semiconductor element 30 is not particularly limited but here they are connected with a bonding wire 50 comprising Al, Au, or the like.

Meanwhile, the thermoplastic resin member 20 seals the other part 42 of the electrical connection member 40 and an opening 21 is formed in the thermoplastic resin member 20. Then at the opening 21, a part of the other part 42 of the electrical connection member 40 is exposed outside the thermoplastic resin member 20.

The opening 21 of the thermoplastic resin member 20 is a part which an external wiring member, for example a connector member or the like, not shown in the figures is inserted into and connected to and the external wiring member is electrically connected to the electrical connection member 40 through the opening 21.

In other words, the electrical connection member 40 functions as a component used for detection, output, and the like of the semiconductor element 30 and the semiconductor element 30 can electrically communicate with the exterior of the device through the electrical connection member 40. Although a terminal comprising a rod-shaped member of Cu, Al, or the like is used as the electrical connection member 40 in the present embodiment, a circuit board or the like may also be used as the electrical connection member 40.

Then as shown in FIGS. 1 and 2, in the present embodiment, a part of the sealed surface 11 of the thermosetting resin member 10 is the roughened surface 11a that has been subjected to a roughening treatment and the other part of the sealed surface 11 is a non-roughened surface 11b that is not subjected to a roughening treatment. The roughened surface 11a is a surface that is more recessed so as to have a step 11c and more roughened than the non-roughened surface 11b.

Further, the non-roughened surface 11b is a surface not subjected to a roughening treatment and the exposed surface 12 of the thermosetting resin member 10 is also a surface not subjected to a roughening treatment similarly to the non-roughened surface 11b. That is, the non-roughened surface 11b and the exposed surface 12 are continuous surfaces having identical characteristics although they are different from each other on the point that the former is sealed with the thermoplastic resin member 20 and the latter is exposed.

Meanwhile, the reason why all of the whole sealed surface 11 is not the roughened surface 11a but a part of the sealed surface 11 is the non-roughened surface 11b and the other part of the sealed surface 11 is the roughened surface 11a is that the cost of the roughening treatment, the shape of the so thermosetting resin member 10 subjected to the roughening treatment, and others are restricted.

The roughened surface 11a is formed through a surface layer removal process as a roughening treatment in a production method that will be described later and the degree of roughening, namely the surface roughness Ra, of the roughened surface 11a is larger than that of the non-roughened surface 11b and the exposed surface 12.

Specifically, the surface roughness Ra of the roughened surface 11a is several μm or more (3 μm or more for example). By contrast, the non-roughened surface 11b and the exposed surface 12 correspond to the surfaces where a surface layer 13 shown in FIG. 3 that will be described later exists. Here, the surface roughness Ra is an arithmetic average roughness Ra defined in JIS (abbreviation of Japanese Industrial Standard).

Further, since the roughened surface 11a is a surface formed by removing the whole surface layer 13 (refer to FIG. 3) of the sealed surface 11, the step 11c is formed between the other part than the roughened surface 11a and the roughened surface 11a at the surface of the thermosetting resin member 10 so that the roughened surface 11a may be recessed from the other part than the roughened surface 11a. The height of the step 11c, namely the difference in height between the non-roughened surface and the roughened surface, is several μm or more (5 μm or more for example).

Here, as shown in FIGS. 1 and 2, in the present embodiment, the direction oriented from the boundary between the sealed surface 11 and the exposed surface 12 of the thermosetting resin member 10 toward the inside of the thermoplastic resin member 20 is defined as a first direction Y1.

On this occasion, the roughened surface 11a is formed closed-circularly over the entire circumference of the sealed surface 11 around an axis parallel so with the first direction Y1. For example, an axis parallel with the first direction Y1 corresponds to a pillar axis of a thermosetting resin member 10 having a prismatic shape. Then in the sealed surface 11, three roughened surfaces 11a, those forming the closed circular shape, are aligned in the first direction Y1 with the non-roughened surfaces 11b interposed as spaces.

Here, as shown in FIGS. 1 and 2, the thermosetting resin member has a a quadrangular columnar shape the axis of which in the longitudinal direction is parallel with the first direction Y1. Then the respective roughened surfaces 11a are formed continuously and closed-circularly over the four side surfaces of the thermosetting resin member 10 and the three roughened surfaces 11a are aligned in the first direction Y1 with spaces interposed. Here, a space between adjacent roughened surfaces 11a includes a non-roughened surface 11b as a matter of course.

Further, in the present embodiment, as shown in FIGS. 1 and 2, the three roughened surfaces 11a are formed only in the sealed surface 11 of the thermosetting resin member 10, namely only inside the thermoplastic resin member 20. As a result, a step 11c that is a boundary between each of the three roughened surfaces 11a and each of the non-roughened surfaces 11b is sealed with the thermoplastic resin member 20.

Figure 5:
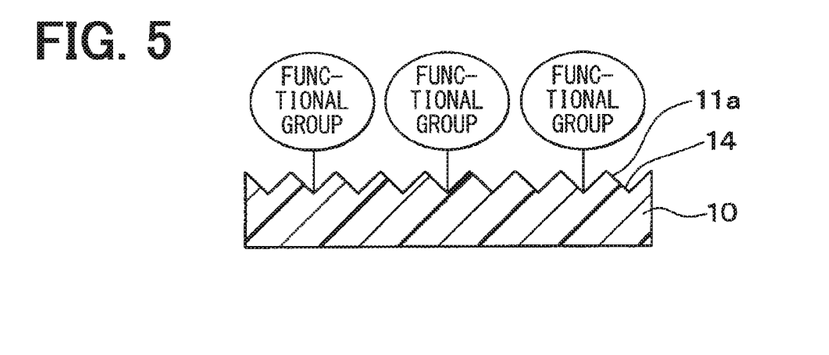
FIG. 5 is an enlarged view of the region R in the cross section of FIG. 1 during a production process succeeding to FIG. 4.
Figure 6:
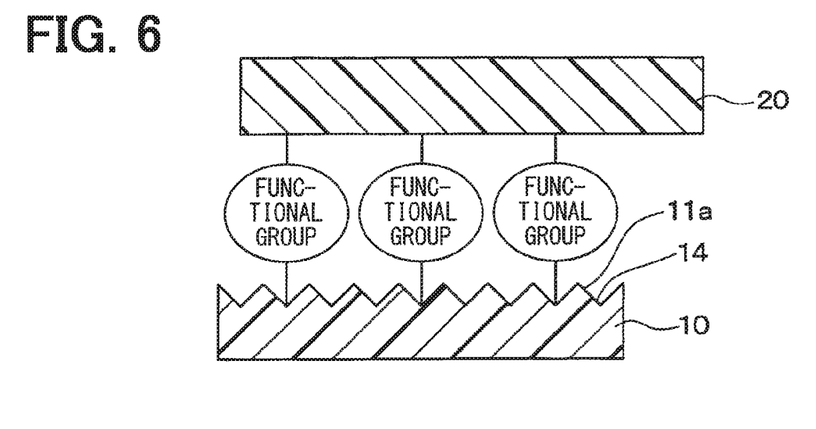
FIG. 6 is an enlarged view of the region R in the cross section of FIG. 1 during a production process succeeding to FIG. 5.
Figure 7:
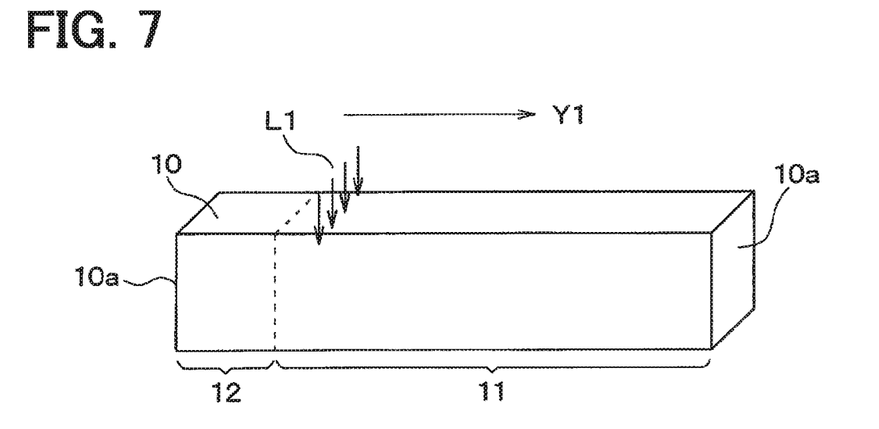
FIG. 7 is a schematic perspective view showing a roughening treatment method by laser irradiation in a production process of the semiconductor device shown in FIG. 1.
Figure 8:
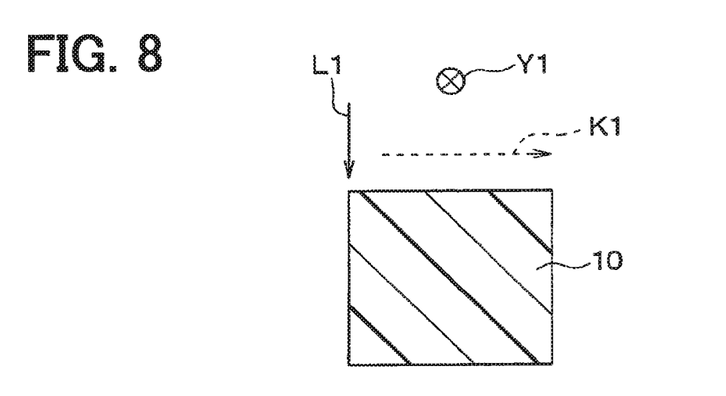
FIG. 8 is a schematic sectional view showing a scanning method of laser irradiation in the roughening treatment shown in FIG. 7.

A method for producing a semiconductor device according to the present embodiment is described hereunder in reference to the views on the production processes shown in FIGS. 3 to 6 and the views on the laser irradiation method shown in FIGS. 7 and 8. Here, an electrical connection member 40 is omitted in FIG. 7.

Figure 3:
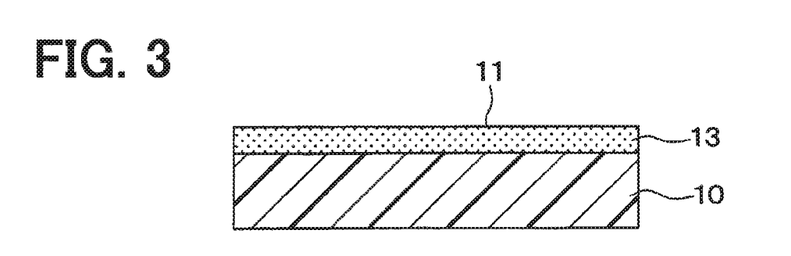
FIG. 3 is an enlarged view of a region R in the cross section of the semiconductor device shown in FIG. 1 during a production process.

Firstly, in a molding and curing process shown in FIG. 3, a thermosetting resin member 10 is formed by: using a thermosetting resin material that is a raw material of the thermosetting resin member 10; and heating and finishing curing the thermosetting resin material.

Specifically, in the molding and curing process, a unit formed by connecting a semiconductor element 30 and an electrical connection member 40 with a bonding wire 50 is: sealed by transfer molding, compression molding, potting molding, or the like; and further heated and cured. In this way, a thermosetting resin member 10 is completed.

A surface layer 13 comprising contaminants exists at the outermost surface of the thermosetting resin member 10 formed at the molding and curing process. The contaminants: exist in a component material of the thermosetting resin member 10; stand out to the uppermost surface during hot forming; and come to be in the state where the contaminants exist less at an inner side. The contaminants here are a release agent, foreign matters attaching to the surface of the thermosetting resin member 10 during processing, and the like for example. The release agent: is a substance that is applied over a die surface or mixed into a thermosetting resin material itself in order to ensure die releasing properties in the molding; and comprises a siloxane, a fatty acid, or the like for example.

Figure 4:
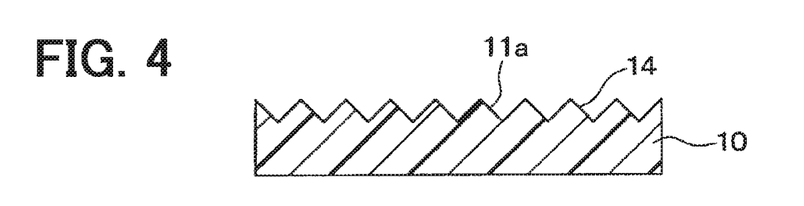
FIG. 4 is an enlarged view of the region R in the cross section of FIG. 1 during a production process succeeding to FIG. 3.

Successively, as shown in FIG. 4, a surface layer removal process is applied to the thermosetting resin member 10. Through the process, a part of a sealed surface 11 of the thermosetting resin member 10, namely a part where a roughened surface 11a is formed in the sealed surface 11, comes to be a new-born surface 14 by removing the surface layer 13 located at the outermost surface.

Specifically, the surface layer 13 is removed by applying a means such as laser irradiation, shot blasting, or the like to a part where a roughened surface 11a is to be formed in the sealed surface 11. Such a means is a means of shaving a treatment surface and forming unevenness and laser irradiation is the most preferable means. The depth of the removal of a sealed surface 11 for forming a roughened surface 11a may be an extent that allows a surface layer 13 to be removed and may be several μm or more (5 μm or more for example).

By such a means, a surface layer 13 as contaminants is removed and a new-born surface 14 as a base of the surface layer 13 is roughened. As a result, an anchoring effect is given to the new-born surface 14 and the new-born surface 14 comes to be a roughened surface 11a excellent in adhesiveness with a thermoplastic resin member 20. Further, actually as shown in FIG. 5, at least one of a hydroxyl group, an epoxy group, and the like exists as a functional group in a thermosetting resin constituting a thermosetting resin member 10 at the new-born surface 14 as the roughened surface 11a.

Here, laser irradiation is preferably used at a surface layer removal process because, by using laser irradiation in particular, a functional group existing at a burnt and oxidized part of a new-born surface 14 accelerates chemical reaction further and a high adhesiveness is materialized. The laser is not limited but a YAG laser or the like is named for example. Further, it is also desirable to further apply corona discharge treatment to a new-born surface 14 of a thermosetting resin member 10 in order to make more functional groups including an OH group and the like exist at a new-born surface 14.

In this way, at the surface layer removal process according to the present embodiment, three roughened surfaces 11a aligned in the first direction as stated earlier are formed by removing a surface layer 13 of the treatment surface of a thermosetting resin member 10. An example of using laser irradiation on this occasion is described concretely in reference to FIGS. 7 and 8.

In this laser irradiation, as shown in FIG. 7, a laser L1 is irradiated from a vertical direction to a side surface of a sealed surface 11 of a cuboidal thermosetting resin member 10. A region of a predetermined width is processed in the first direction Y1 by scanning the side surface with the laser L1 so in the first direction Y1. In the present embodiment, the laser irradiation is applied to three regions aligned in the first direction of the side surface.

In this case, as shown in FIG. 8, the laser L1 is applied to the thermosetting resin member 10 by scanning the side surface from an end toward the other end of the side surface in a width direction. The processing by laser irradiation is carried out by combining the scanning in the width direction and the scanning in the first direction Y1.

After the processing is applied to a side surface in this way, the thermosetting resin member 10 is rotated by 90° and processing is applied to a second side surface similarly to the first side surface. Successively, the thermosetting resin member 10 is rotated by 90° and processing is applied to a third side surface likewise. Further, the thermosetting resin member 10 is rotated by 90° and processing is applied to a fourth side surface likewise. As a result, the thermosetting resin member 10 having three closed-circular roughened surfaces 11a is completed.

Then after the surface layer removal process, a plastic molding process shown in FIG. 6 is carried out. In the process, a thermoplastic resin material containing an additive 20a that is a raw material of a thermoplastic resin member 20 is applied by injection molding to a roughened surface 11a as a new-born surface 14 of a thermosetting resin member 10 having a functional group.

For example, by mixing a polymer having a functional group that comes to be an additive 20a with a thermoplastic resin material that comes to be a mother material, a thermoplastic resin material containing the additive 20a can be obtained. As a result, a sealed surface 11 of a thermosetting resin member 10 is sealed with a thermoplastic resin member 20 while a functional group existing in a roughened surface 11a and a functional group existing in the additive 20a bond chemically to each other.

In the case of using an epoxy resin for a thermosetting resin member 10 for example, a chemical bond in the plastic molding process is obtained by chemically bonding a hydroxyl group or an epoxy group in the epoxy resin to a hydroxyl group, an epoxy group, an amino group, or a carbonyl group existing in an additive 20a.

Then in the case of a bond between hydroxyl groups, a bond between epoxy groups, or a similar bond, the bond is a covalent bond and hence is a stronger chemical bond. That is, a covalent bond can be materialized by using a material containing at least one functional group identical to a functional group contained in a material constituting a thermosetting resin member 10 as a material constituting an additive 20a.

Then by the chemical bond, a high adhesiveness between a roughened surface 11a as a new-born surface 14 of a thermosetting resin member 10 and a thermoplastic resin member 20 can be obtained. In this way, a semiconductor device as a resin molded boy according to the present embodiment is completed.

Meanwhile, respective processes succeeding to the surface layer removal process are selectively applied to a part of the surface of a thermosetting resin member 10 and hence the respective processes are applied after masking or the like is applied appropriately to a surface not to be processed.

Effects of the first embodiment are described. According to the present embodiment, a resin molded body is configured so that three closed-circular roughened surfaces 11a may be aligned in a first direction Y1 that is an exfoliation progressing direction with non-roughened surfaces 11b interposed as spaces at a sealed surface 11.

Consequently, roughened surfaces 11a that are located at both the ends of a beginning end and a terminal end in the alignment of three roughened surfaces 11a aligned in the first direction Y1 are located so as to be closer to both the ends of a sealed surface 11 in the first direction Y1. Then the roughened surfaces 11a located at both the ends of the sealed surface 11 in the first direction Y1 are located at places of the sealed surface 11 where a stress is higher than a stress at the roughened surface 11a located in the center of the sealed surface 11.

As a result, even when the roughened surfaces 11a located at the parts where a stress is high exfoliate from a thermoplastic resin member 20, the exfoliation is inhibited from progressing because steps 11c caused by the non-roughened surfaces 11b exist between the roughened surfaces 11a where the exfoliation is caused and the roughened surface 11a in the center. From those reasons, according to the present embodiment, it is possible to inhibit exfoliation from progressing at a bonding interface between both the resin materials of a thermosetting resin member 10 and a thermoplastic resin member 20.

Moreover, according to the present embodiment, it can be said that the roughened surfaces 11a located at both the ends of a beginning end and a terminal end in the alignment of three roughened surfaces 11a aligned sequentially in the first direction Y1 function as sacrificial regions for inhibiting a roughened surface 11a located in the middle from exfoliating.

Second Embodiment

Figure 9:
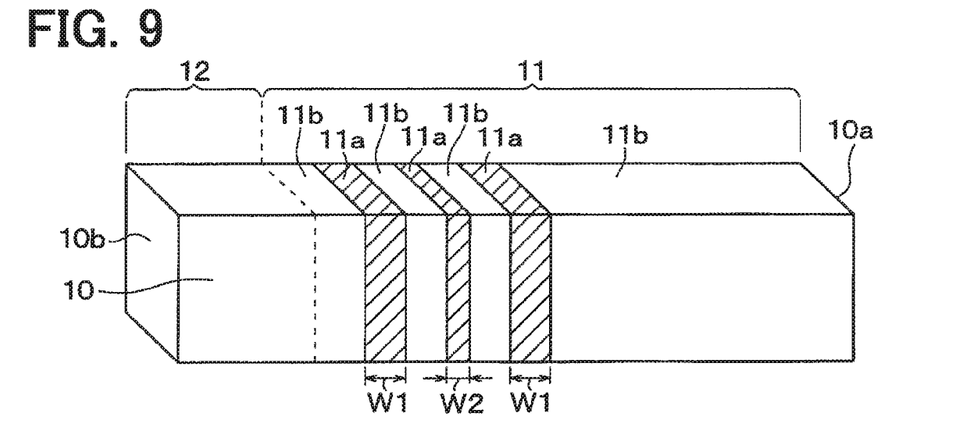
FIG. 9 is an external perspective view schematically showing a thermosetting resin member in a semiconductor device according to a second embodiment.
Figure 10:
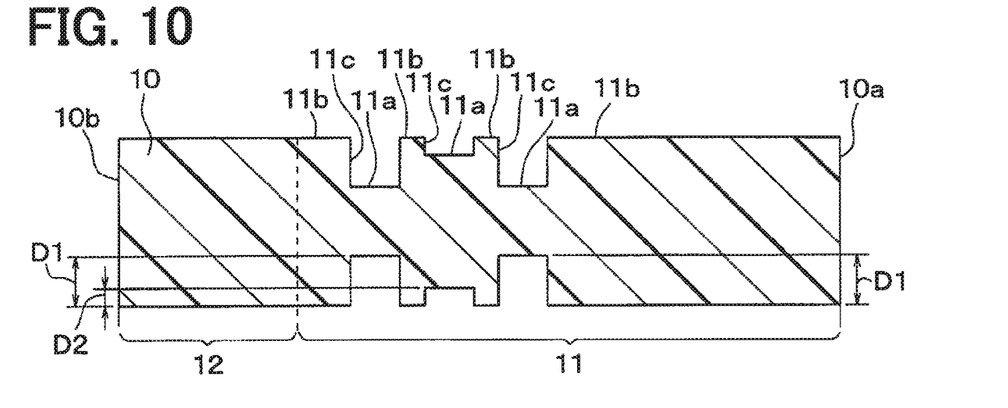
FIG. 10 is a schematic sectional view showing another example of the thermosetting resin member according to the second embodiment.

A semiconductor device according to a second embodiment is described in reference to FIGS. 9 and 10 while attention is focused on the points different from the first embodiment. In FIG. 9 here, a roughened surface 11a formed at the surface of a thermosetting resin member 10 is shown by hatching the surface and an electrical connection member 40 is omitted.

Firstly in the example of FIG. 9, the width W1 in a first direction Y1 of two roughened surfaces 11a located at both the ends in the first direction Y1 which is the direction where three roughened surfaces 11a are aligned is larger than the width W2 in the first direction Y1 of a roughened surface 11a located between both the ends.

Further in the example of FIG. 10, the height D1 of steps 11c of two a roughened surfaces 11a located at both the ends in the first direction Y1 which is the direction where three roughened surfaces 11a are aligned is larger than the height D2 of a step 11c of a roughened surface 11a located between both the ends.

As stated earlier, the two roughened surfaces 11a located at both the ends in the alignment direction among the three closed-circular roughened surfaces 11a aligned in the first direction Y1 are located at places where a stress is larger than a stress at the roughened surface 11a located in the middle of the two roughened surfaces 11a. That is, the two roughened surfaces 11a are more likely to exfoliate at a bonding interface than the roughened surface 11a located in the middle.

According to the example of FIG. 9 taking the above aspect into consideration, the length of the bonding interfaces at the two roughened surfaces 11a can be increased and exfoliation over the whole two roughened surfaces 11a is likely to be inhibited. Further, in the case of the example of FIG. 10, since the height of the steps 11c of the two roughened surfaces 11a is large, the two roughened surfaces 11a are more likely to be inhibited from exfoliating.

Moreover, it goes without saying that a configuration combining both the example of FIG. 9 and the example of FIG. 10, namely a configuration having the relationship of W1>W2 and D1>D2, may also be adopted in order to materialize the effects at a higher level.

Third Embodiment

Figure 11:
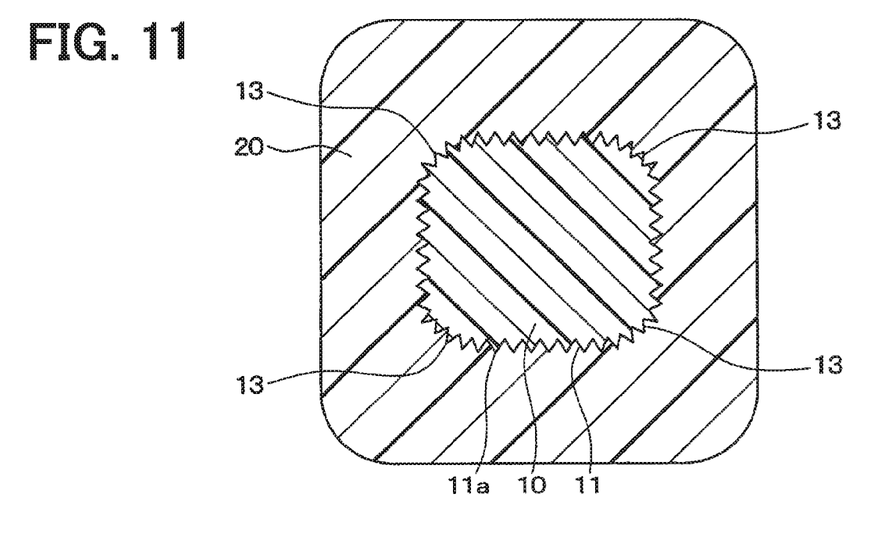
FIG. 11 is a schematic sectional view of a thermosetting resin member and a thermoplastic resin member in a semiconductor device according to a third embodiment.

A semiconductor device according to a third embodiment is described in reference to FIG. 11 while attention is focused on the points different from the first embodiment. Here in FIG. 11, an additive 20a in a thermoplastic resin member 20 is omitted.

As stated earlier, a thermosetting resin member 10 has a quadrangular columnar shape the axis of which in the longitudinal direction is parallel with a first direction Y1 and a roughened surface 11a is formed continuously and closed-circularly over all the four side surfaces of the thermosetting resin member 10. In the present embodiment here, the roughened surface 11a is formed so that corner parts 13 located between the side surfaces may take a rounded shape.

When a closed-circular roughened surface 11a is formed in a thermosetting resin member 10 of a quadrangular columnar shape in this way, if corner parts 13 located between side surfaces are angular, a large stress is likely to concentrate at the corner parts 13 and exfoliation is likely to be generated at a bonding interface. The stress concentration can be relatively small preferably when the corner parts 13 have a round shape in view of the above point.

Meanwhile, although the explanations have heretofore been made based on a thermosetting resin member 10 of a quadrangular columnar shape, besides the quadrangular columnar shape, a thermosetting resin member 10 of a polygonal columnar shape such as a triangular columnar shape, a pentagonal columnar shape, a hexagonal columnar shape, or the like for example may also be adopted and, on this occasion too, similar effects can be expected by adopting corner parts 13 of a round shape.

Further, it goes without saying that the present embodiment can be combined not only with the first embodiment but also with the second embodiment.

Examples modified from the above embodiments are described. Here, although the number of roughened surfaces 11a is three in each of the embodiments, the number of roughened surfaces 11a may be any number as long as the number is three or more and, for example, may be four, five, or more than five. Also on any of those occasions, it is acceptable as long as multiple closed-circular roughened surfaces 11a are aligned sequentially in a first direction. Then the roughened surfaces 11a located at both the ends of a beginning end and a terminal end in the alignment of the multiple roughened surfaces 11a: function as a sacrificial region of exfoliation similarly to the above case; and exhibit the effect of inhibiting exfoliation similarly to the above case.

Further, a thermosetting resin member 10 may also have a cylindrical shape. In the case of a cylindrical shape, such corner parts 13 at side surfaces as seen in a thermosetting resin member 10 of a prismatic shape do not exist at closed-circular roughened surfaces 11a forming a bonding interface by nature and hence stress concentration at corner parts 13 can preferably be avoided.

Furthermore, the three-dimensional shape of a thermosetting resin member 10 is not limited to a columnar shape such as a prismatic shape, a cylindrical shape, or the like, those being described earlier, and may also be another shape. Moreover, as the form of sealing with a thermoplastic resin member 20, any form is acceptable as long as the form allows a part of the surface of a thermosetting resin member 10 to be sealed and the other part to be exposed and the form is not limited to the form of having a sealed surface 11 on the side of an end 10a and an exposed surface on the side of the other end 10b of the thermosetting resin member 10 as shown in the above illustrated examples.

Further, as a first sealed component and a second sealed component, any components are acceptable as long as they can be sealed with a thermosetting resin member 10 and they are not limited to a semiconductor element 30 and an electrical connection member 40 or a circuit board described earlier.

Furthermore, in the above embodiments, a resin molded body is a semiconductor device and a semiconductor element 30 that is a sealed component sealed with a thermosetting resin member 10 and the like are installed in the thermosetting resin member 10. The resin molded body however is not limited to such a semiconductor device and may also be configured so that a thermosetting resin member 10 may not have a sealed component for example.

Meanwhile, the present disclosure is not limited to the aforementioned embodiments and can be modified appropriately within the scope described in the claims. In addition, the embodiments are not unrelated to each other and can be combined appropriately except the case where the combination is obviously impossible, and further are not limited to the above illustrated examples.

While the present disclosure has been described with reference to embodiments thereof, it is to be understood that the disclosure is not limited to the embodiments and constructions. The present disclosure is intended to cover various modification and equivalent arrangements. In addition, the various combinations and configurations, other combinations and configurations, including more, less or only a single element, are also within the spirit and scope of the present disclosure.

The invention claimed is:

1. A resin molded body comprising:
a thermosetting resin member that is made of thermosetting resin; and
a thermoplastic resin member that is made of thermoplastic resin to seal a sealed surface, which is a part of a surface of the thermosetting resin member, wherein:
an exposed surface, which is the other part of the surface of the thermosetting resin member, is exposed from the thermoplastic resin member;
a part of the sealed surface of the thermosetting resin member is a non-roughened surface that is not subjected to a roughening treatment;
the other part of the sealed surface of the thermosetting resin member is a roughened surface, which is recessed from the non-roughened surface to form a step and is more roughened than the non-roughened surface;
the thermoplastic resin member includes an additive added thereto, and the additive contains a functional group;
a functional group existing in the roughened surface and the functional group existing in the additive are chemically bonded together;
a direction from a boundary between the sealed surface and the exposed surface toward an inside of the thermoplastic resin member is a first direction;
the roughened surface has a closed-circular shape that is formed over an entire circumference of the sealed surface around an axis parallel to the first direction;
the roughened surface is one of three or more roughened surfaces each having a closed-circular shape on the sealed surface;
the three or more roughened surfaces are arranged along the first direction with the non-roughened surface interposed as a distance between each adjacent two of the three or more roughened surfaces; and
two of the three or more roughened surfaces at both their ends in a direction in which the three or more roughened surfaces are arranged have larger widths along the first direction than the rest of the three or more roughened surfaces located between the two of the three or more roughened surfaces.

2. The resin molded body according to claim 1, wherein:
the thermosetting resin member has a prismatic shape whose axis in its longitudinal direction is an axis parallel to the first direction;
the roughened surface has the closed-circular shape, which is continuous over all of side surfaces of the thermosetting resin member; and
at a corner part located between each adjacent two of the side surfaces of the thermosetting resin member, the roughened surface is formed so that the corner part has a round shape.

3. A resin molded body comprising:
a thermosetting resin member that is made of thermosetting resin; and
a thermoplastic resin member that is made of thermoplastic resin to seal a sealed surface, which is a part of a surface of the thermosetting resin member, wherein:
an exposed surface, which is the other part of the surface of the thermosetting resin member, is exposed from the thermoplastic resin member;
a part of the sealed surface of the thermosetting resin member is a non-roughened surface that is not subjected to a roughening treatment;
the other part of the sealed surface of the thermosetting resin member is a roughened surface, which is recessed from the non-roughened surface to form a step and is more roughened than the non-roughened surface;

the thermoplastic resin member includes an additive added thereto, and the additive contains a functional group;

a functional group existing in the roughened surface and the functional group existing in the additive are chemically bonded together;

a direction from a boundary between the sealed surface and the exposed surface toward an inside of the thermoplastic resin member is a first direction;

the roughened surface has a closed-circular shape that is formed over an entire circumference of the sealed surface around an axis parallel to the first direction;

the roughened surface is one of three or more roughened surfaces each having a closed-circular shape on the sealed surface;

the three or more roughened surfaces are arranged along the first direction with the non-roughened surface interposed as a distance between each adjacent two of the three or more roughened surfaces; and each of two of the three or more roughened surfaces at both their ends in a direction in which the three or more roughened surfaces are arranged has the step, whose height is larger than the rest of the three or more roughened surfaces located between the two of the three or more roughened surfaces.

4. The resin molded body according to claim 3, wherein two of the three or more roughened surfaces at both their ends in a direction in which the three or more roughened surfaces are arranged have larger widths along the first direction than the rest of the three or more roughened surfaces located between the two of the three or more roughened surfaces.

5. The resin molded body according to claim 3, wherein:

the thermosetting resin member has a prismatic shape whose axis in its longitudinal direction is an axis parallel to the first direction;

the roughened surface has the closed-circular shape, which is continuous over all of side surfaces of the thermosetting resin member; and at a corner part located between each adjacent two of the side surfaces of the thermosetting resin member, the roughened surface is formed so that the corner part has a round shape.

* * * * *